(12) United States Patent
Luo et al.

(10) Patent No.: US 12,225,716 B2
(45) Date of Patent: Feb. 11, 2025

(54) SEMICONDUCTOR DEVICE AND MANUFACTURING METHOD THEREOF

(71) Applicant: CHANGXIN MEMORY TECHNOLOGIES, INC., Hefei (CN)

(72) Inventors: Qu Luo, Hefei (CN); ChengYeh Hsu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 510 days.

(21) Appl. No.: 17/455,691

(22) Filed: Nov. 19, 2021

(65) Prior Publication Data

US 2022/0077289 A1   Mar. 10, 2022

Related U.S. Application Data

(63) Continuation of application No. PCT/CN2021/076304, filed on Feb. 9, 2021.

(30) Foreign Application Priority Data

Feb. 14, 2020   (CN) .......................... 202010092525.8

(51) Int. Cl.
*H10B 12/00*   (2023.01)
*H01L 29/40*   (2006.01)
(Continued)

(52) U.S. Cl.
CPC ......... *H10B 12/488* (2023.02); *H01L 29/401* (2013.01); *H01L 29/4236* (2013.01);
(Continued)

(58) Field of Classification Search
CPC ...... H10B 12/36; H10B 12/056; H10B 12/00; H10B 12/488; H01L 29/4236
See application file for complete search history.

(56) References Cited

U.S. PATENT DOCUMENTS 7,291,533 B2   11/2007   Von Schwerin
7,312,114 B2   12/2007   Kudelka
(Continued)

FOREIGN PATENT DOCUMENTS

CN   102034761 A   4/2011
CN   109216433 A   1/2019
(Continued)

OTHER PUBLICATIONS

Written Opinion cited in PCT/CN2021/076304, mailed on May 14, 2021, 8 pages.
(Continued)

*Primary Examiner* — Joseph C. Nicely
(74) *Attorney, Agent, or Firm* — Kilpatrick Townsend & Stockton LLP

(57) ABSTRACT

Disclosed are a semiconductor device and a manufacturing method thereof. The method includes: providing a semiconductor substrate; forming a first wordline trench structure; forming a first sacrificial layer at the bottom of the first wordline trench structure; filling the first wordline trench structure located in active regions by epitaxial growth; forming a first insulation layer covering the top of the semiconductor substrate and the first wordline trench structure; forming a second wordline trench structure and a fin-type structure in the active regions, a depth of the second wordline trench structure being less than that of the first wordline trench structure, and a projection of the second wordline trench structure in a vertical direction completely overlapping with a projection of the first sacrificial layer in the vertical direction; removing the first sacrificial layer; and filling the first wordline trench structure, the second wordline trench structure and the wordline tunnel.

18 Claims, 11 Drawing Sheets

(51) Int. Cl.
*H01L 29/423* (2006.01)
*H01L 29/41* (2006.01)

(52) U.S. Cl.
CPC ........... *H10B 12/00* (2023.02); *H10B 12/056* (2023.02); *H10B 12/36* (2023.02); *H01L 29/413* (2013.01)

(56) References Cited

U.S. PATENT DOCUMENTS

2019/0043864 A1* 2/2019 Takesako .............. H01L 21/845
2019/0131445 A1* 5/2019 Liu ..................... H01L 29/6656

FOREIGN PATENT DOCUMENTS

CN 109390339 A 2/2019
CN 211789011 U 10/2020

OTHER PUBLICATIONS

International Search Report as cited in PCT Application No. PCT/CN2021/076304 mailed May 14, 2021, 10 pages.

* cited by examiner

SEMICONDUCTOR DEVICE AND MANUFACTURING METHOD THEREOF

CROSS-REFERENCE TO RELATED APPLICATIONS

This application is a continuation application of International Patent Application No. PCT/CN2021/076304, filed on Feb. 9, 2021, which claims priority to Chinese Patent Application No. 202010092525.8, filed with the Chinese Patent Office on Feb. 14, 2020 and entitled "SEMICONDUCTOR DEVICE AND MANUFACTURING METHOD THEREOF". International Patent Application No. PCT/CN2021/076304 and Chinese Patent Application No. 202010092525.8 are incorporated herein by reference in their entireties.

TECHNICAL FIELD

The present invention relates to a semiconductor device and a manufacturing method thereof.

BACKGROUND

In order to improve the integration of dynamic random access memories to speed up the operation of elements and to meet the needs of consumers for miniaturized electronic devices, buried wordline dynamic random access memories have been developed in recent years to meet the above requirements.

SUMMARY

According to some embodiments, the present invention provides a manufacturing method of a semiconductor device, including:

providing a semiconductor substrate having a shallow trench isolation (STI) structure and a plurality of active regions disposed in parallel;

forming a first wordline trench structure in the semiconductor substrate;

forming a first sacrificial layer at the bottom of the first wordline trench structure;

filling the first wordline trench structure located in the active regions by epitaxial growth;

forming a first insulation layer covering the top of the semiconductor substrate and the first wordline trench structure in the STI structure and sealing the first wordline trench structure;

forming a second wordline trench structure and a fin-type structure in the active regions, a depth of the second wordline trench structure being less than that of the first wordline trench structure, and a projection of the second wordline trench structure in a vertical direction completely overlapping with a projection of the first sacrificial layer in the vertical direction;

removing the first sacrificial layer to form a wordline tunnel in the semiconductor substrate connected with the first wordline trench structure; and filling the first wordline trench structure, the second wordline trench structure and the wordline tunnel to form an buried wordline structure surrounding the fin-type structure.

According to some embodiments, the present invention further provides a semiconductor device, including:

a semiconductor substrate having a STI structure and a plurality of active regions disposed in parallel;

an buried wordline structure located in the semiconductor substrate, extending along a first direction, and crossing the STI structure and the plurality of active regions; and a fin-type structure located in a region where the active regions intersect with the buried wordline structure, the buried wordline structure wrapping around the fin-type structure.

Details of one or more embodiments of the present application are set forth in the following accompanying drawings and descriptions. Other features and advantages of the present application become obvious with reference to the specification, the accompanying drawings, and the claims.

BRIEF DESCRIPTION OF DRAWINGS

In order to more clearly illustrate the technical solutions in embodiments of the present application or the conventional technology, the accompanying drawings used in the description of the embodiments or the conventional technology will be briefly introduced below. It is apparent that, the accompanying drawings in the following description are only some embodiments of the present application, and other drawings can be obtained by those of ordinary skill in the art from the provided drawings without creative efforts.

REFERENCE NUMERALS

Figure 1:
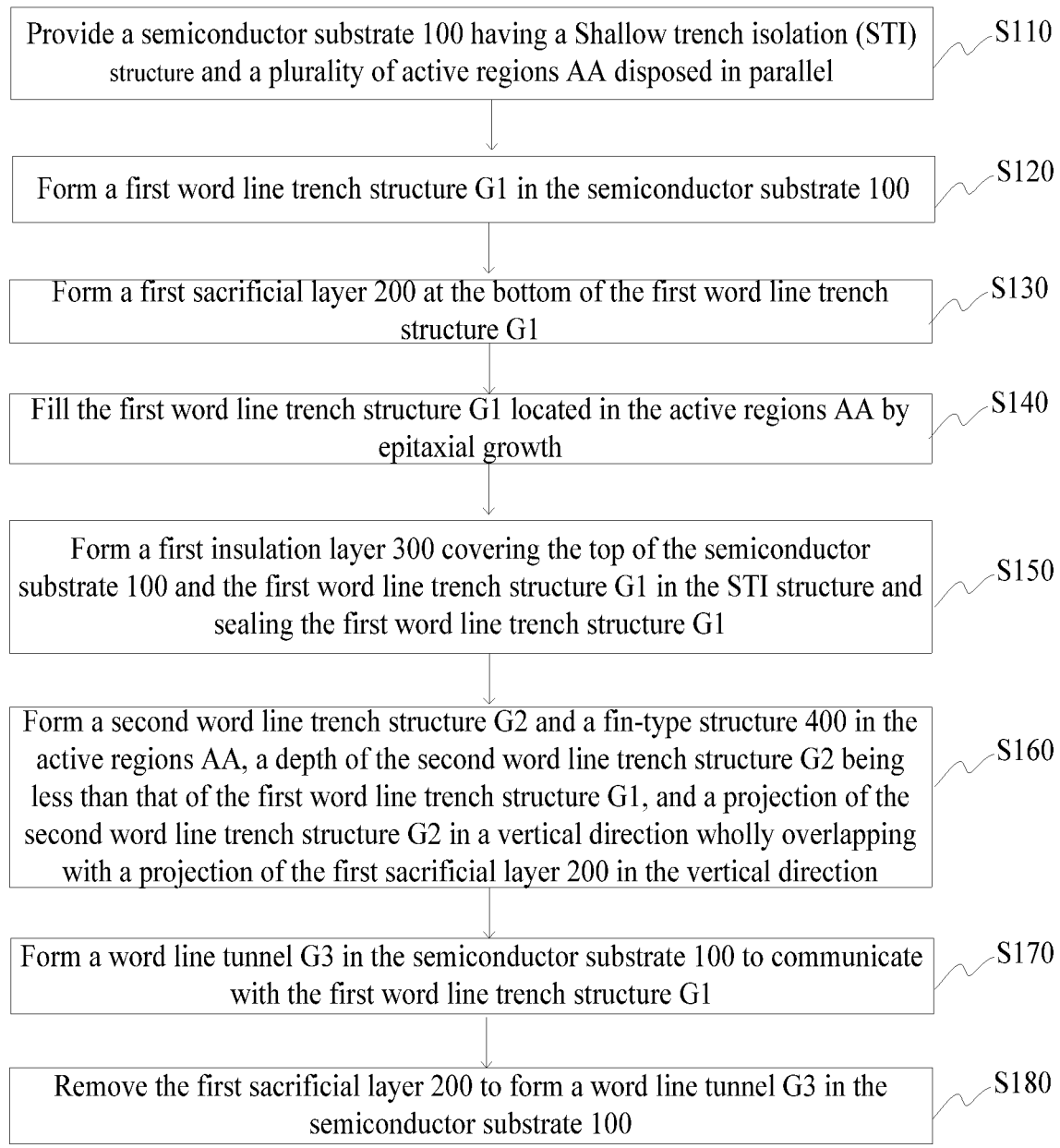
FIG. 1 is a flowchart of a manufacturing method of a semiconductor device according to an embodiment of the present invention.

100 Semiconductor substrate
110 Silicon material layer
120 Oxide material layer
130 back substrate
200 First sacrificial layer
300 First insulation layer 400 Fin-type structure
500 Buried wordline structure
510 Gate oxide layer
520 Metal barrier layer
530 Metal conductive layer
600 Second insulation layer
STI Shallow trench isolation
AA active region
G1 First wordline trench structure
G2 Second wordline trench structure
G3 wordline tunnel.

DESCRIPTION OF EMBODIMENTS

With an increase in the integration of memories, an area of an active region is often affected by process limitations of a random access memory due to its small size, which limits a control capability of a gate and a channel width, thus leading to a higher turn-on voltage, a slower turn-on speed and a lower operating current of the semiconductor device and then affecting its performance.

In order to make the above objectives, features and advantages of the present invention more comprehensible, specific implementations of the present invention are described in detail below with reference to the accompanying drawings. Many specific details are described below for full understanding of the present invention. However, the present invention may be implemented in other manners different from those described herein. It may be appreciated by those of ordinary person skilled in the art that similar improvement may be made without departing from the idea of the present invention. The present invention is thus not limited by specific embodiments disclosed below.

Referring to FIG. 1, an embodiment of the present invention provides a manufacturing method of a semiconductor device, including the following steps.

Figure 2:
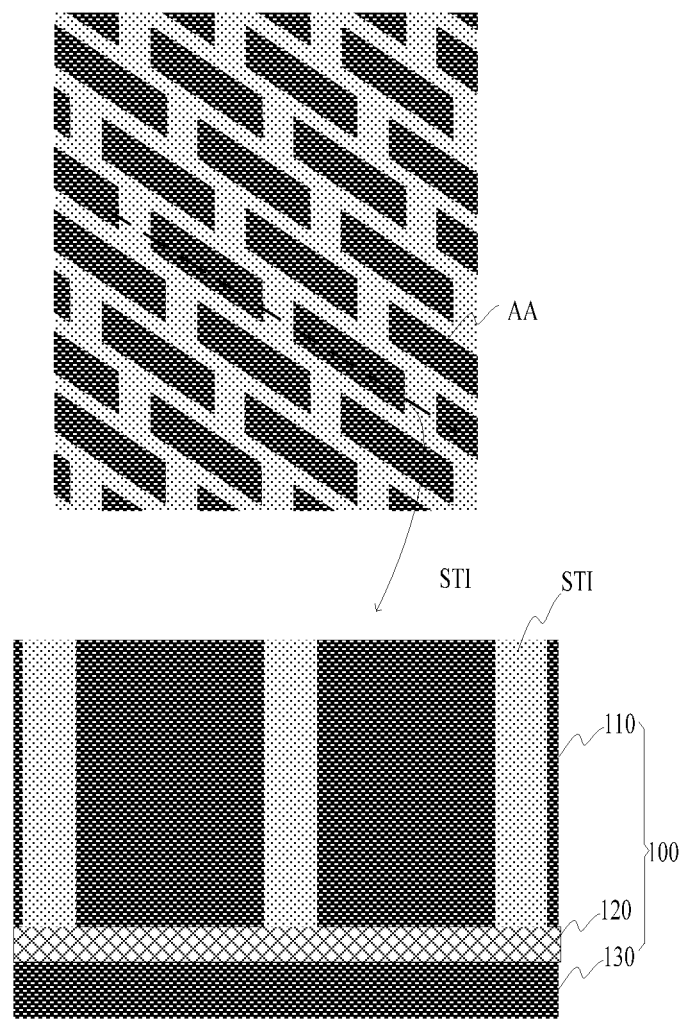
FIG. 2 is a schematic structural diagram of a semiconductor substrate according to an embodiment of the present invention.

In step S110, a semiconductor substrate 100 having a STI structure and a plurality of active regions AA disposed in parallel is provided, referring to FIG. 2.

Figure 3:
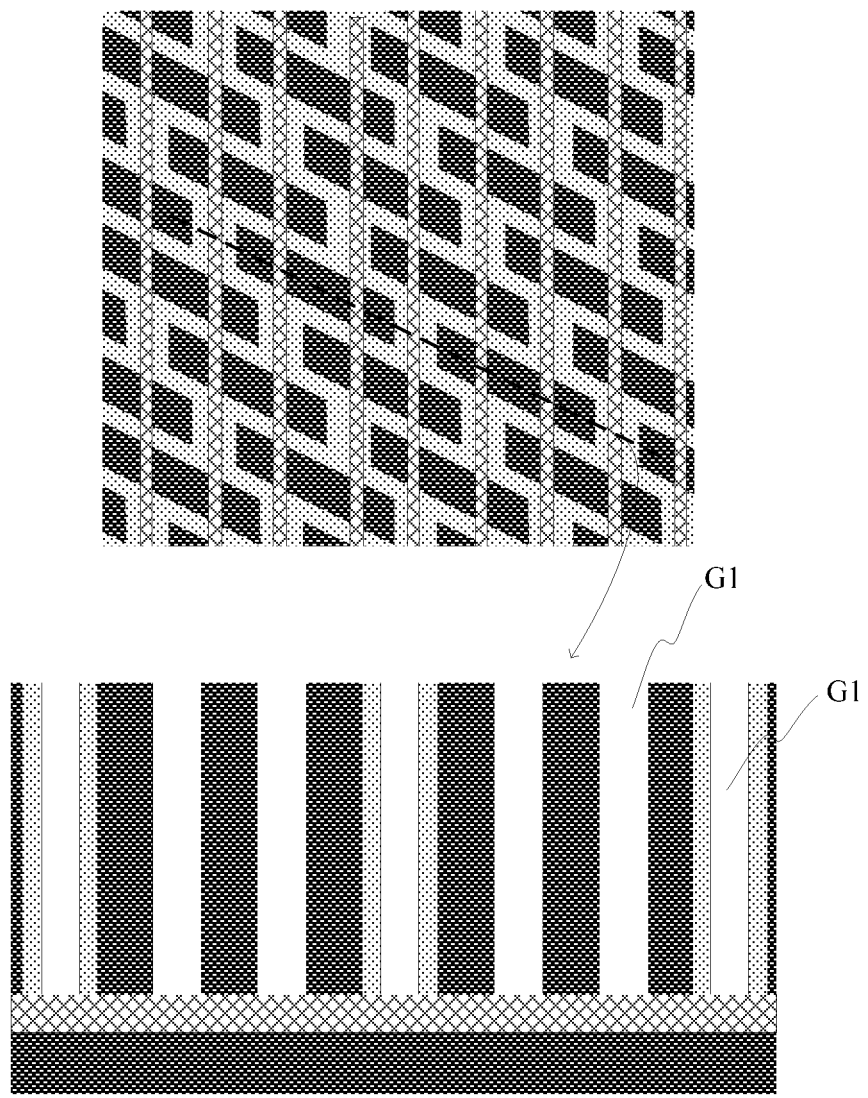
FIG. 3 is a schematic structural diagram of a semiconductor substrate provided with a first wordline trench structure according to an embodiment of the present invention.

In step S120, a first wordline trench structure G1 is formed in the semiconductor substrate 100, referring to FIG. 3.

Figure 4:
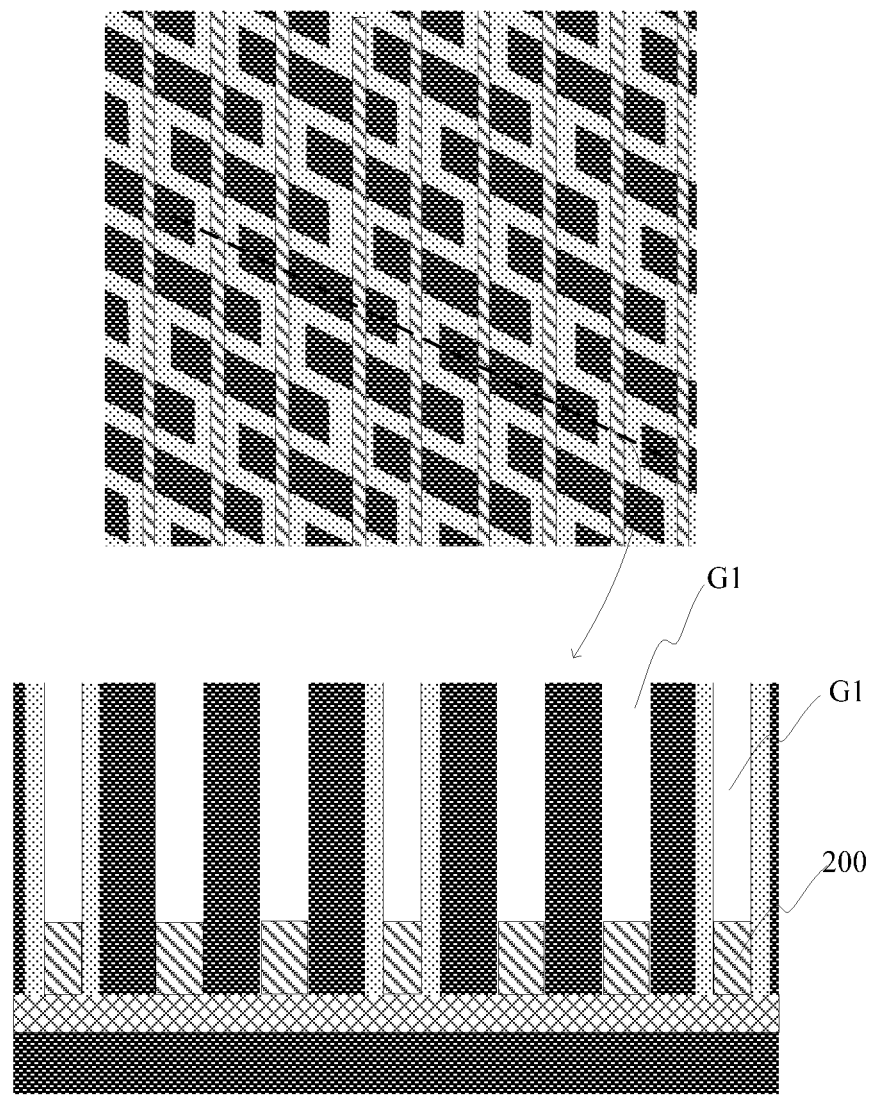
FIG. 4 is a schematic structural diagram of a semiconductor substrate provided with a first sacrificial layer according to an embodiment of the present invention.

In step S130, a first sacrificial layer 200 is formed at the bottom of the first wordline trench structure G1, referring to FIG. 4.

Figure 5:
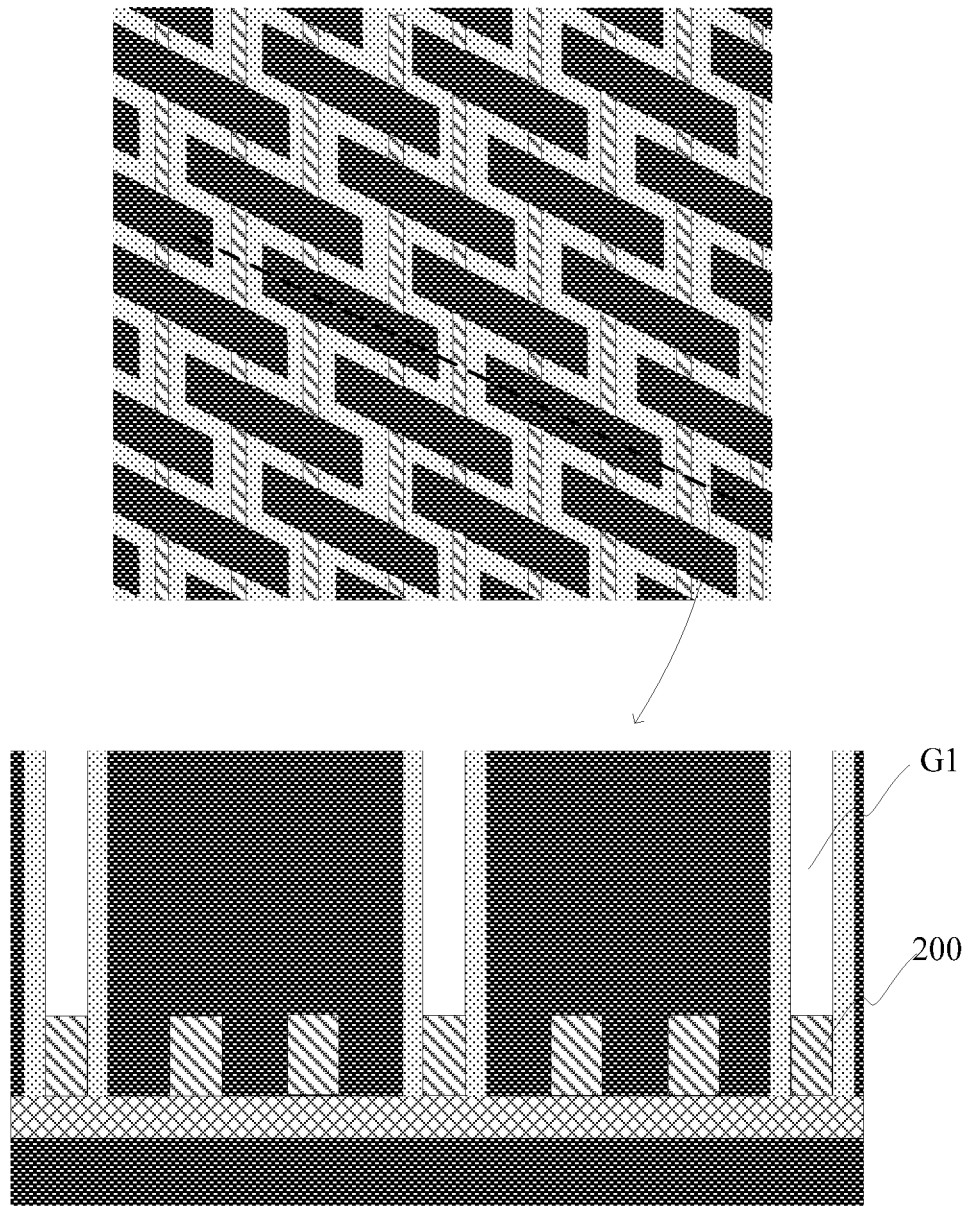
FIG. 5 is a schematic structural diagram of a semiconductor substrate after the first wordline trench structure in the active regions is filled according to an embodiment of the present invention.

In step S140, the first wordline trench structure G1 located in the active regions AA is filled by epitaxial growth, referring to FIG. 5.

Figure 6:
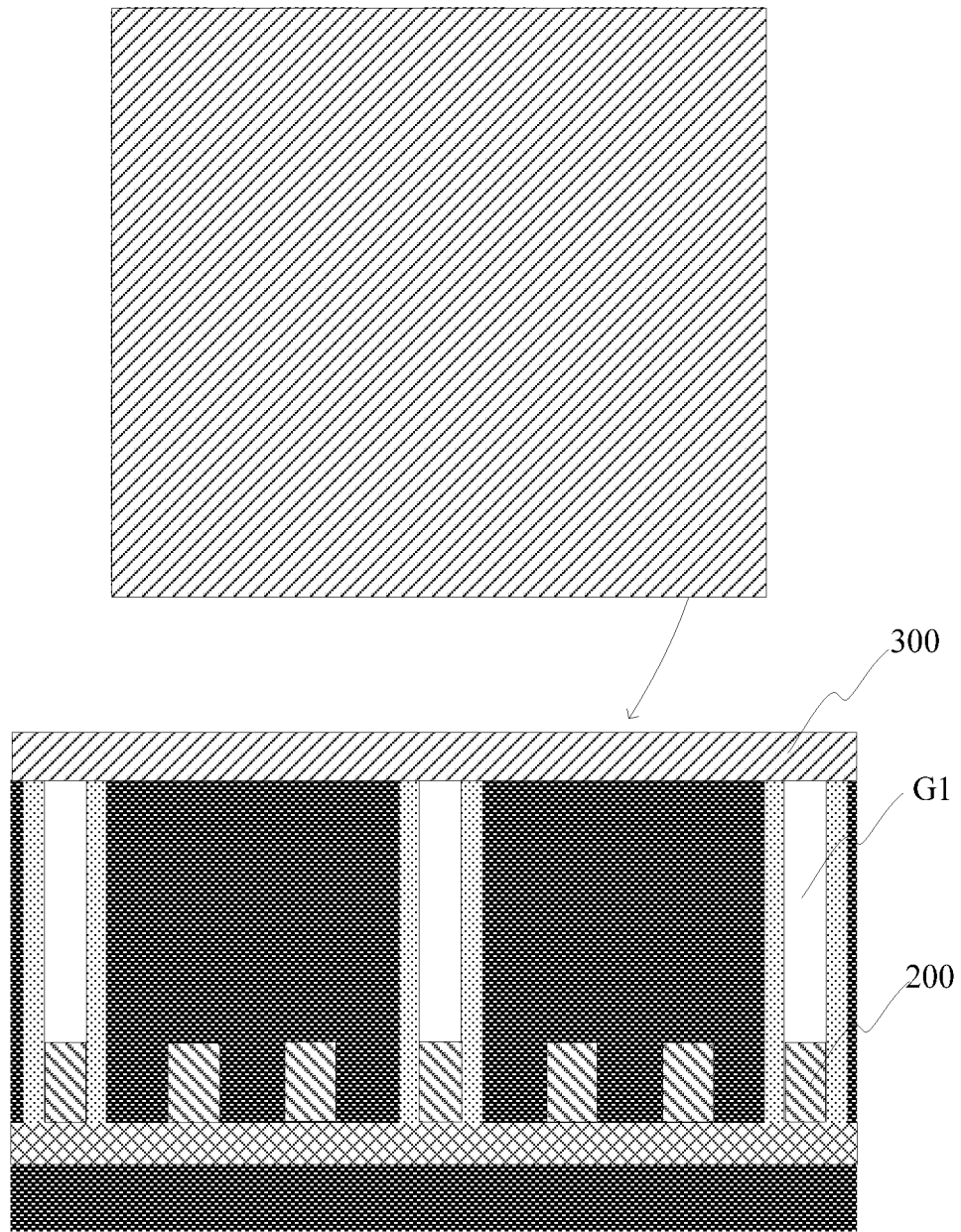
FIG. 6 is a schematic structural diagram of a semiconductor substrate provided with a first insulation layer according to an embodiment of the present invention.

In step S150, a first insulation layer 300 covering the top of the semiconductor substrate 100 and the first wordline trench structure G1 in the STI structure and sealing the first wordline trench structure G1 is formed, referring to FIG. 6.

Figure 7:
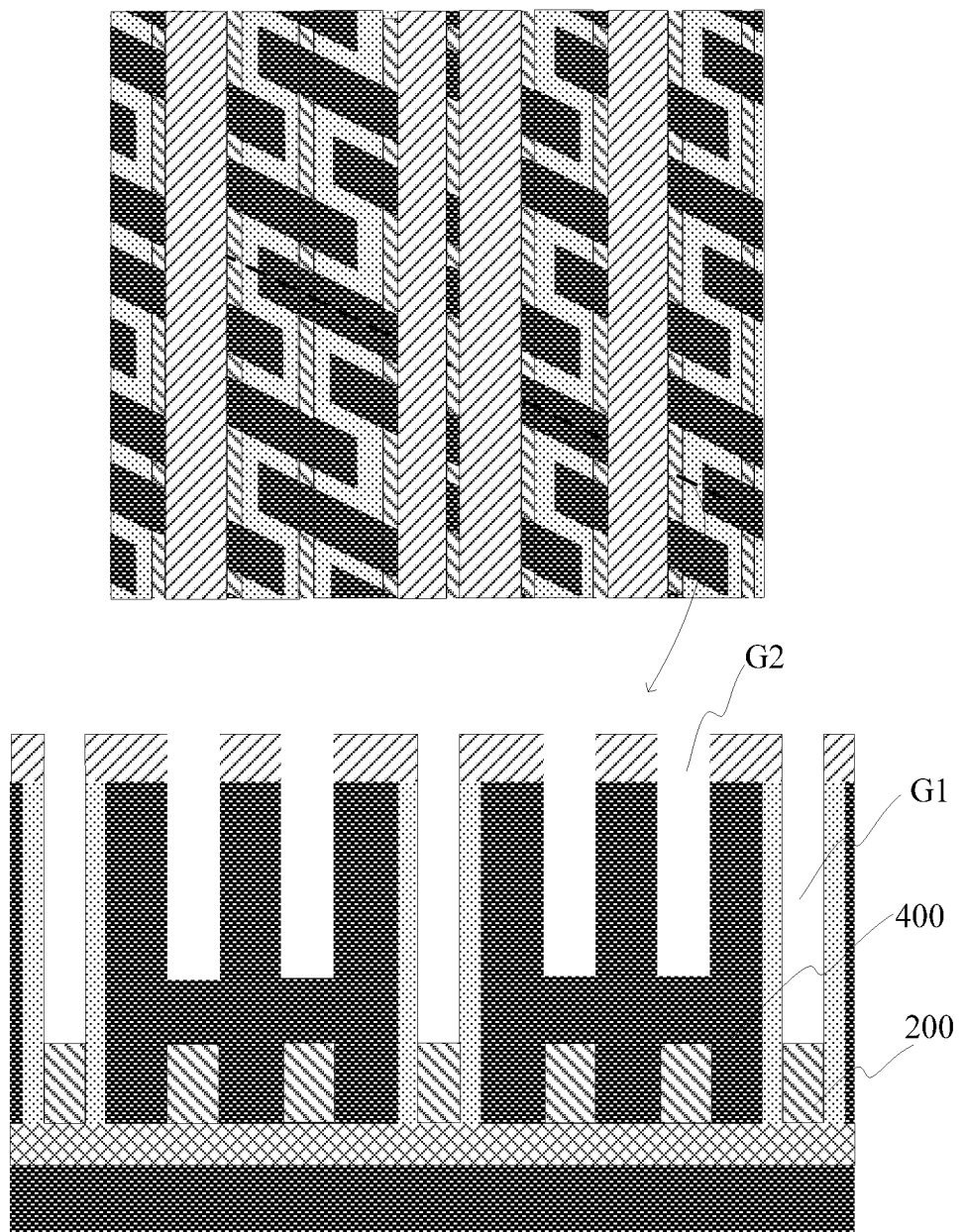
FIG. 7 is a schematic structural diagram of a semiconductor substrate provided with a second wordline trench structure and a fin-type substrate according to an embodiment of the present invention.

In step S160, a second wordline trench structure G2 and a fin-type structure 400 are formed in the active regions AA, a depth of the second wordline trench structure G2 is less than that of the first wordline trench structure G1, and a projection of the second wordline trench structure G2 in a vertical direction completely overlaps with a projection of the first sacrificial layer 200 in the vertical direction, referring to FIG. 7.

Figure 8:
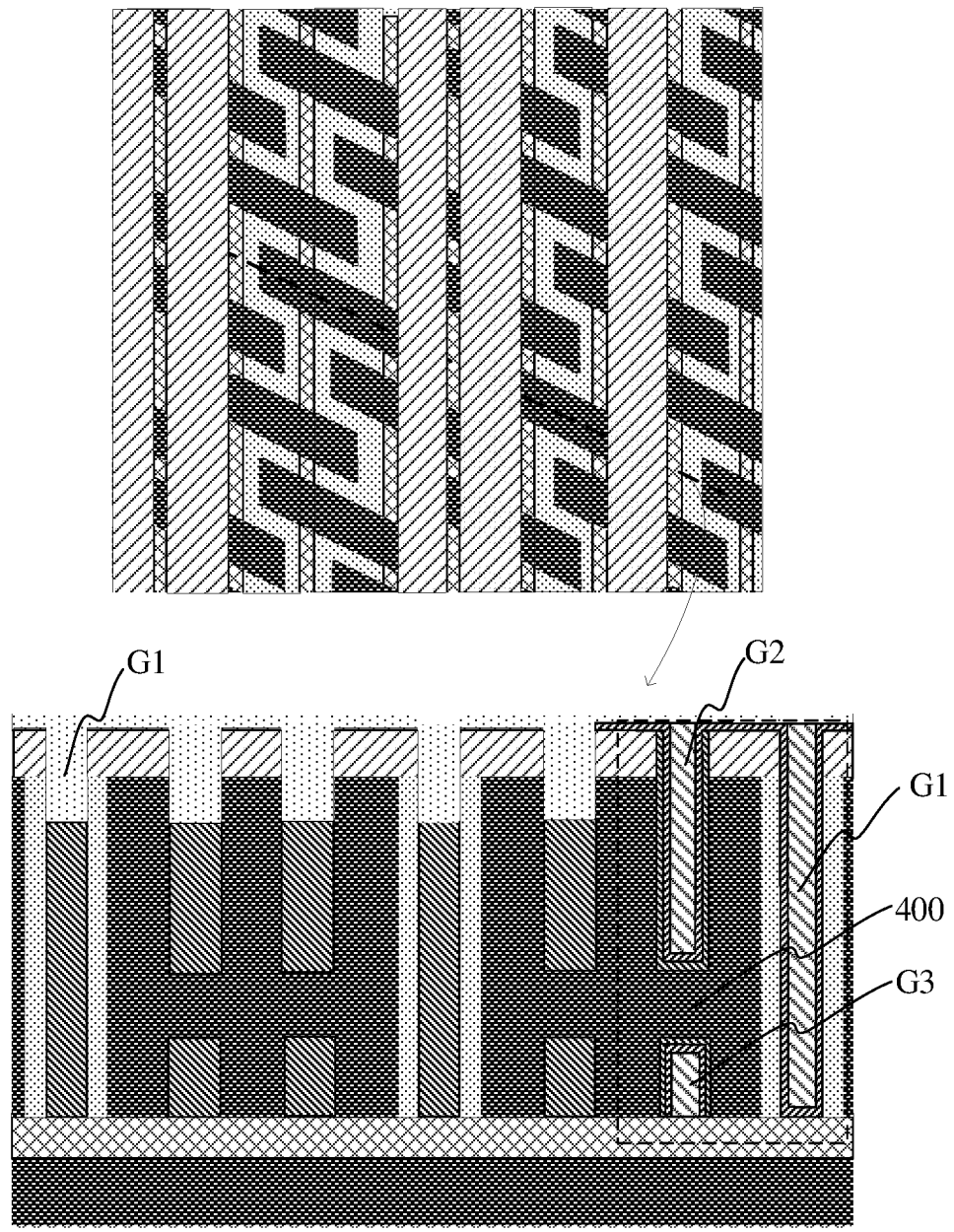
FIG. 8 is a schematic structural diagram of a semiconductor substrate provided with a wordline tunnel according to an embodiment of the present invention.

In step S170, the first sacrificial layer 200 is removed to form a wordline tunnel G3 in the semiconductor substrate 100 connected with the first wordline trench structure G1, referring to FIG. 8.

Figure 9:
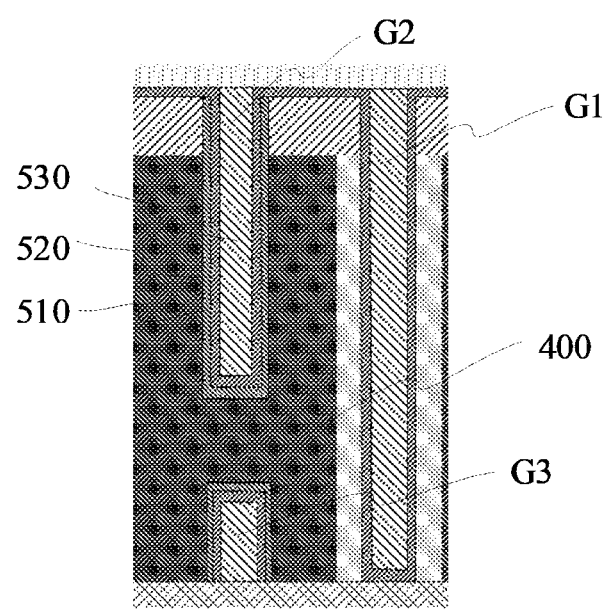
FIG. 9 is a schematic diagram of an buried wordline structure in the dashed box in FIG. 8.
Figure 10:
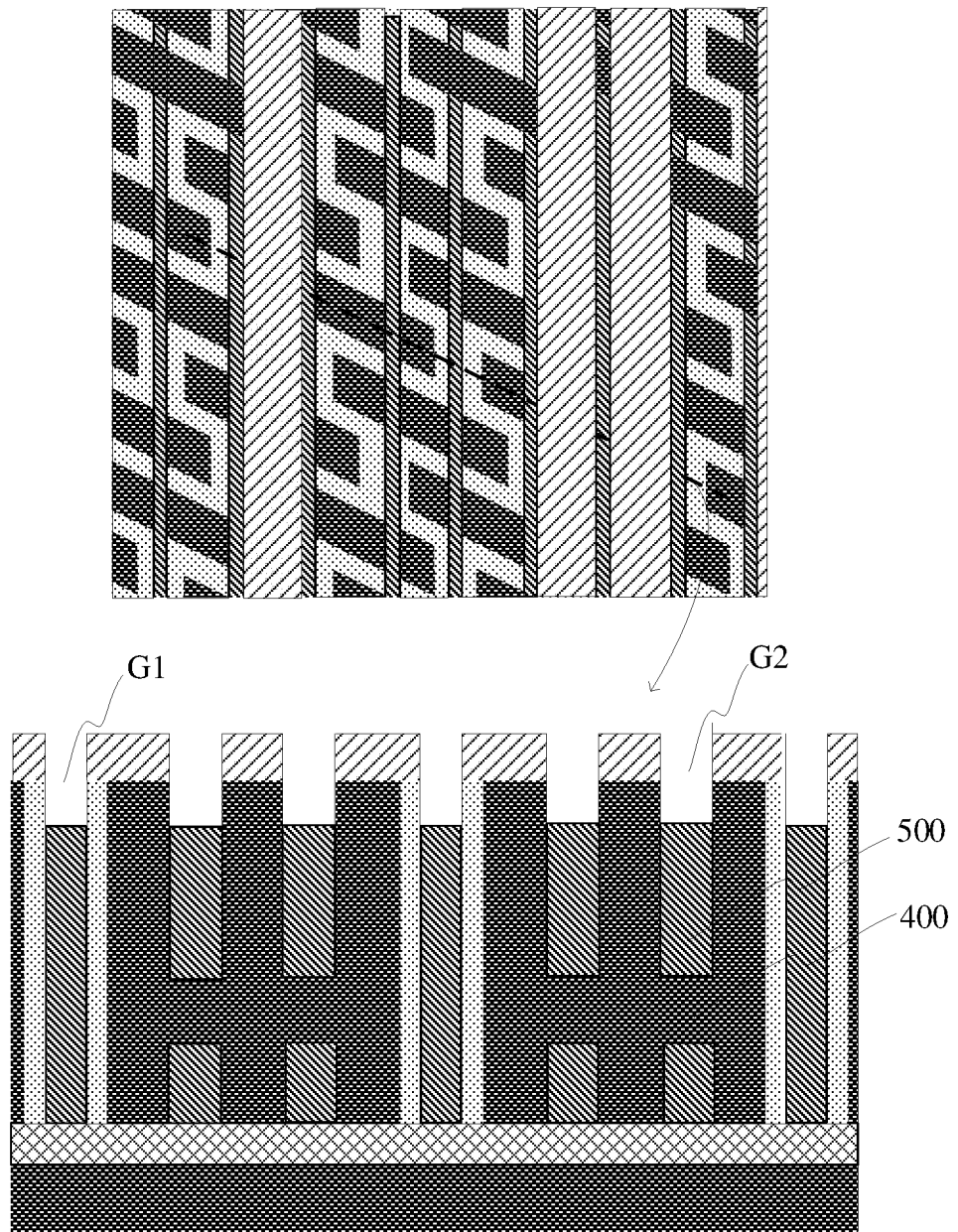
FIG. 10 is a schematic structural diagram of a semiconductor substrate provided with an buried wordline structure according to an embodiment of the present invention.

In step S180, the first wordline trench structure G1, the second wordline trench structure G2 and the wordline tunnel G3 are filled to form an buried wordline structure 500 surrounding the fin-type structure 400, referring to FIG. 9 to FIG. 10.

In the present embodiment, firstly, the first wordline trench structure G1 is formed; then, the first sacrificial layer 200 is formed at the bottom of the first wordline trench structure G1, the first wordline trench structure G1 located in the active regions AA is filled by epitaxial growth, and the second wordline trench structure G2 is formed by etching; next, the first sacrificial layer 200 is etched to form the wordline tunnel G3 connected with the first wordline trench structure G1; and finally, the first wordline trench structure G1, the second wordline trench structure G2 and the wordline tunnel G3 are filled with a metal conductive material with low resistance such as aluminum, tungsten, copper or a titanium aluminum alloy to form the buried wordline structure 500 surrounding the fin-type structure 400. Since the fin-type structure 400 is surrounded by the buried wordline structure 500, the switching efficiency can be improved, a threshold voltage thereof can be reduced, and an operating current thereof can be increased, which is conducive to improving the refresh efficiency.

In one embodiment, the semiconductor substrate 100 is a silicon-on-insulator (SOI) substrate, including a silicon material layer 110, a back substrate 130 and an oxide material layer 120 sandwiched between the silicon material layer 110 and the back substrate 130.

It may be understood that, in the present embodiment, the SOI substrate is used, and the oxide material layer 120 may be used as an etch stop layer in the process of etching the first wordline trench structure G1, to facilitate the control over the depth of the first wordline trench structure G1. Moreover, the oxide material layer 120 may eliminate the influence of a leakage current in a semiconductor substrate and further improve the performance of the semiconductor device. The silicon material layer 110 may be either an undoped silicon material layer 110 or a doped silicon material layer 110. The doped silicon material layer 110 may be an N-type or P-type doped silicon material layer 110.

In one embodiment, the step of forming a first wordline trench structure G1 in the semiconductor substrate 100 includes:

forming a photoresist layer on the semiconductor substrate 100;

forming, in the photoresist layer, a target pattern matching the first wordline trench structure G1;

etching the silicon material layer 110 by using the patterned photoresist layer as a mask layer and the oxide material layer 120 as an etch stop layer, to form the first wordline trench structure G1; and removing the remaining photoresist layer.

In the present embodiment, the photoresist layer is formed by applying a layer of photoresist to a surface of the silicon material layer 110 by spin coating, and the photoresist layer is irradiated by a laser through a mask to cause a chemical reaction of a photoresist in an exposed region. Then, the photoresist in the exposed region or an unexposed region is dissolved and removed using a developing technology (the former is referred to as a positive photoresist and the latter as a negative photoresist), and a pattern on the mask is transferred to the photoresist layer to form a target pattern. Then, the silicon material layer 110 is etched by using the patterned photoresist layer as the mask layer and the oxide material layer 120 as the etch stop layer, to form the first wordline trench structure G1. Finally, the remaining photoresist layer is removed to form the first wordline trench structure G1.

In one embodiment, the first wordline trench structure G1 has a width ranging from 10 nm to 25 nm.

It may be understood that, the first sacrificial layer 200 is required to be formed subsequently in the first wordline trench structure G1, an aspect ratio of the first wordline trench structure G1 should be taken into account to avoid advanced sealing during filling of a material forming the first sacrificial layer 200, thus forming a cavity. The aspect ratio of the first wordline trench structure G1 should be controlled within a reasonable range. In the present embodiment, the depth of the first wordline trench structure G1 is equal to the thickness of the silicon material layer 110, which generally ranges from 100 nm to 200 nm. Thus, the width of the first wordline trench structure G1 may be set within a range of 10 nm to 25 nm and then the aspect ratio thereof is controlled within a range of 4 to 20, avoiding generation of a cavity in the first sacrificial layer 200. In the present embodiment, the first wordline trench structure G1 has a width ranging from 21 nm to 23 nm.

In one embodiment, the first sacrificial layer 200 is formed by a material having an etching selectivity greater than 1 relative to the silicon material layer 110 and the oxide material layer 120.

It may be understood that, when the first sacrificial layer 200 is formed by the material having an etching selectivity greater than 1 relative to the silicon material layer 110 and the oxide material layer 120, the material forming the first sacrificial layer 200 may be rapidly etched by dry etching by selecting suitable etch gas, and the silicon material layer 110 and the STI structure are slowly etched. The silicon material layer 110 and the STI structure are almost unetched. In the present embodiment, the first sacrificial layer 200 is formed by silicon nitride. In addition, other insulating materials with an etching ratio greater than 1 to Si and SiO may also be used instead of the silicon nitride.

In one embodiment, the step of forming a first sacrificial layer 200 at the bottom of the first wordline trench structure G1 includes:

depositing a silicon nitride material by using an atomic layer deposition technology on the semiconductor substrate 100 where the metal barrier layer is formed, to form a silicon nitride material layer 110 filling the first wordline trench structure G1 and covering the semiconductor substrate 100; and etching back the silicon nitride material layer 110, and controlling a thickness of the remaining silicon nitride material layer to be 20 nm to 80 nm, to form the first sacrificial layer 200.

In the present embodiment, the silicon nitride material is deposited by using the atomic layer deposition technology to form the silicon nitride material layer 110 filling the first wordline trench structure G1 and covering the semiconductor substrate 100. Then, silicon nitride on a top surface of the semiconductor substrate 100 is etched away, and silicon nitride in the first wordline trench structure G1 is etched to a preset height range, to form the first sacrificial layer 200. In addition, the silicon nitride material layer 110 may also be formed in other deposition manners, such as chemical vapor deposition (CVD), low pressure CVD (LPCVD), plasma-enhanced CVD (PECVD) and atomic layer deposition (ALD).

In one embodiment, the first sacrificial layer 200 has a height H1 ranging from 20 nm to 80 nm.

In a specific design scheme, the first sacrificial layer 200 has a height ranging from 20 nm to 80 nm. Since the thickness of the first sacrificial layer 200 determines the lowest high end of the fin-type structure 400 and determines a position of a conductive channel, it should not be too small in general so as to prevent occurrence of a gap during subsequent filling of a metal material. Therefore, in the present embodiment, the height of the first sacrificial layer 200 is limited to a range of 20 nm to 80 nm. In some embodiments, the first sacrificial layer 200 has a height H1 ranging from 50 nm to 70 nm. Specifically, the first sacrificial layer 200 has a height of 50 nm, 55 nm, 60 nm, 65 nm or 70 nm.

When the first wordline trench structure G1 is filled by epitaxial growth after the first sacrificial layer 200 is formed, only a monocrystalline silicon material is fixedly grown on a sidewall of the silicon material layer 110, so as to achieve the purpose of filling the first wordline trench structure G1 located in the active regions AA. At the same time, the grown monocrystalline silicon material may have the same characteristics as the silicon material layer 110, and may also have different conductivity from the silicon material layer 110. Next, under a condition of 400° C. to 500° C., the silicon oxide material is deposited at a rate of 15 nm/s to 20 nm/s by a deposition process, and the first wordline trench structure G1 is sealed to form the first insulation layer. In general, the insulation layer on the surface of the semiconductor substrate 100 has a thickness ranging from 50 nm to 150 nm. In the present embodiment, the thickness of the insulation layer is set in a range of 50 nm to 150 nm. Then, the insulation layer and the semiconductor substrate 100 are etched to form the second wordline trench structure G2. In the present embodiment, the insulation layer and the semiconductor substrate 100 are etched by a dry etching process. Due to the geometric effect of the sidewall of the silicon material layer 110, the silicon oxide material forming the STI structure on the sidewall of the silicon material layer 110 may not be etched away.

In one embodiment, the first sacrificial layer 200 is removed by a wet etching process.

In the present embodiment, the first sacrificial layer 200 is made of a silicon nitride material. Since part of the silicon nitride material is located below the fin-type structure 400 and dry etching cannot be used, the silicon nitride material is removed by hot phosphoric acid at a temperature ranging from 80° C. to 120° C., or by high-temperature phosphoric acid at a temperature ranging from 150° C. to 200° C.

In one embodiment, the step of filling the first wordline trench structure G1, the second wordline trench structure G2 and the wordline tunnel G3 to form an buried wordline structure 500, as shown in FIG. 9, includes:

forming a gate oxide layer 510 on a sidewall and the bottom of the second wordline trench structure G2 and a sidewall and the top of the wordline tunnel G3;

forming a metal barrier layer 520 on the semiconductor substrate 100 where the gate oxide layer 510 is formed, the metal barrier layer 520 covering the gate oxide layer 510, the first insulation layer 300 and the STI structure;

filling a metal conductive material in the first wordline trench structure G1, the second wordline trench structure G2 and the wordline tunnel G3 to form a metal conductive layer 530; and etching back the metal barrier layer 520 and the metal conductive material in the first wordline trench structure G1 and the second wordline trench structure G2 to a preset height to form the buried wordline structure 500.

In the present embodiment, the buried wordline structure 500 includes the gate oxide layer 510, the metal barrier layer 520 and the metal conductive layer 530. The metal conductive layer 530 is a tungsten material layer. In addition, a metal material with low resistance such as aluminum, copper or a titanium aluminum alloy may be used instead. The metal barrier layer 520 is made of a TiN material. A combination of a TiN material layer and the gate oxide layer 510, compared with the gate oxide layer 510 alone, is conducive to increasing a dielectric constant, reducing a gate length, increasing a driving current and reducing a threshold voltage. The gate oxide layer 510 is grown using an in-situ steam generation (ISSG) technology. In addition, the gate oxide layer 510 may also be grown by ALD or other thermal oxidation methods.

Figure 11:
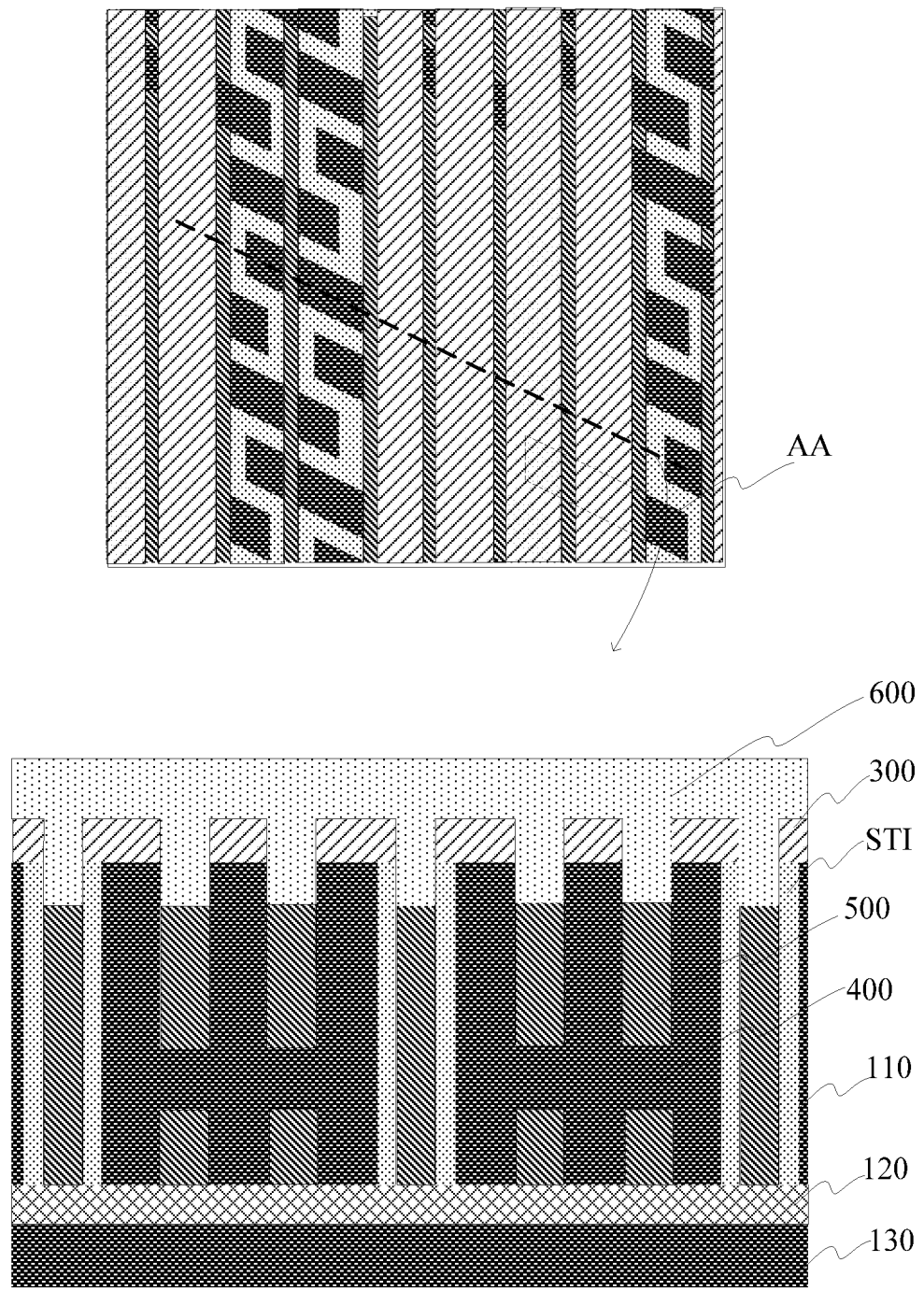
FIG. 11 is a schematic structural diagram of a semiconductor substrate provided with a second insulation layer according to an embodiment of the present invention.

Referring to FIG. 11, in one embodiment, the manufacturing method further includes:

forming a second insulation layer 600 on the semiconductor substrate 100 where the buried wordline structure 500 is formed, the second insulation layer 600 covering the first insulation layer 300 and the buried wordline structure 500.

In the present embodiment, a silicon nitride material is deposited by a deposition process on the semiconductor substrate 100 where the buried wordline structure 500 is formed, the first wordline trench structure G1 and the second wordline trench structure G2 are filled, and the first insulation layer 300 is covered. Above the first insulation layer 300, the second insulating layer 600 has a thickness ranging from 20 nm to 50 nm. In some embodiments, the second insulating layer 600 has a thickness of 40 nm, 45 nm or 50 nm. The silicon nitride material has good insulation performance, so in addition to preventing leakage by increasing the thickness of the insulation layer, the silicon nitride material is usually selected to manufacture the second insulation layer 600. In addition, the second insulation layer 600 may also be made of silicon nitride, silicon nitride carbide or other suitable insulating materials, but is not limited thereto.

Based on the same inventive concept, an embodiment of the present invention further provides a semiconductor device. Still referring to FIG. 11, the semiconductor device includes: a semiconductor substrate 100, a buried wordline structure 500 and a fin-type structure 400.

The semiconductor substrate 100 has STI structure and a plurality of active regions AA disposed in parallel.

The buried wordline structure 500 is located in the semiconductor substrate 100, extends along a first direction, and crosses the STI structure and the plurality of active regions AA.

The fin-type structure 400 is located in a region where the active regions AA intersect with the buried wordline structure 500, and the buried wordline structure 500 wraps around the fin-type structure 400.

The semiconductor device of the present invention includes the buried wordline structure 500 provided with the fin-type structure and surrounding the fin-type structure 400. Since the fin-type structure 400 is surrounded by the buried wordline structure 500, the switching efficiency can be improved, a threshold voltage thereof can be reduced, and an operating current thereof can be increased, which is conducive to improving the refresh efficiency.

In one embodiment, the semiconductor substrate 100 is an SOI substrate, including a silicon material layer 110, a back substrate 130 and an oxide material layer 120 sandwiched between the silicon material layer 110 and the back substrate 130.

It may be understood that, in the present embodiment, the SOI substrate is used, and the oxide material layer 120 may be used as an etch stop layer in the process of etching the first wordline trench structure G1, to facilitate the control over the depth of the first wordline trench structure G1. Moreover, the oxide material layer 120 may eliminate the influence of a leakage current in the semiconductor substrate and further improve the performance of the semiconductor device. The silicon material layer 110 may be either an undoped silicon material layer 110 or a doped silicon material layer 110. The doped silicon material layer 110 may be an N-type or P-type doped silicon material layer 110.

In one embodiment, the buried wordline structure 500 located below the fin-type structure 400 has a height ranging from 20 nm to 80 nm.

In a specific design scheme, the first sacrificial layer 200 has a height ranging from 20 nm to 80 nm. Since the thickness of the first sacrificial layer 200 determines the lowest height of the fin-type structure 400 and determines the position of the conductive channel, it should not be too small in general so as to prevent occurrence of a gap during subsequent filling of a metal material. Therefore, in the present embodiment, the height of the first sacrificial layer 200 is limited to a range of 20 nm to 80 nm. In some embodiments, the first sacrificial layer 200 has a height H1 ranging from 50 nm to 70 nm. Specifically, the first sacrificial layer 200 has a height of 50 nm, 55 nm, 60 nm, 65 nm or 70 nm.

In one embodiment, the buried wordline structure located above the fin-type structure has a height ranging from 10 nm to 100 nm.

In general, the formed second trench structure has a depth ranging from 50 nm to 150 nm. After the second trench structure is filled and etched back, an etch-back height in the second trench structure generally ranges from 50 nm to 100 nm, and the buried wordline structure located above the fin-type structure has a height ranging from 10 nm to 100 nm. A specific depth should be designed as required. In some embodiments, in a specific manufacturing process, the second trench structure formed in the silicon substrate has a depth ranging from 90 nm to 110 nm. After the second trench structure is filled and etched back, an etch-back height in the second trench structure generally ranges from 64 nm to 75 nm, and the buried wordline structure located above the fin-type structure has a height ranging from 30 nm to 45 nm. In some embodiments, the buried wordline structure located above the fin-type structure has a height of 30 nm, 35 nm, 40 nm or 45 nm. The position of the conductive channel can be determined by controlling the depth of the second trench structure, and the resistance value of the buried wordline structure can be adjusted by controlling the etch-back height in the second trench structure.

In one embodiment, the buried wordline structure 500 includes a metal conductive layer 530. The metal conductive layer 530 is insulated from the fin-type structure 400 and wraps around the fin-type structure 400. In the present embodiment, the metal conductive layer 530 is a tungsten material layer. In addition, a metal material with low resistance such as aluminum, copper or a titanium aluminum alloy may be used instead.

In one embodiment, the buried wordline structure 500 further includes:

a gate oxide layer 510 disposed on a surface of the semiconductor substrate facing the metal conductive layer 530 and wrapping the buried wordline structure 500; and a metal barrier layer 520 disposed between the gate oxide layer 510 and the metal conductive layer 530.

In the present embodiment, the metal barrier layer 520 is made of a TiN material. A combination of a TiN material layer and the gate oxide layer 510, compared with the gate oxide layer 510 alone, is conducive to increasing a dielectric constant, reducing a gate length, increasing a driving current and reducing a threshold voltage. The gate oxide layer 510 is grown using an ISSG technology. In addition, the gate oxide layer 510 may also be grown by ALD or other thermal oxidation methods.

In one embodiment, the buried wordline structure 500 has a height ranging from 10 nm to 25 nm.

It may be understood that, the first sacrificial layer 200 is required to be formed subsequently in the first wordline trench structure G1, an aspect ratio of the first wordline trench structure G1 should be taken into account to avoid advanced sealing when a material forming the first sacrificial layer 200 is filled, thus forming a cavity. The aspect ratio of the first wordline trench structure G1 should be controlled within a reasonable range. In the present embodiment, the depth of the first wordline trench structure G1 is equal to the thickness of the silicon material layer 110, which generally ranges from 100 nm to 200 nm. Thus, the width of the first wordline trench structure G1 may be set within a range of 10 nm to 25 nm and then the aspect ratio thereof is controlled within a range of 4 to 20, avoiding generation of a cavity in the first sacrificial layer 200. In the present embodiment, the first wordline trench structure G1 has a width ranging from 21 nm to 23 nm.

In one embodiment, the semiconductor device further includes an insulation layer (300, 600) including a first insulation layer 300 and a second insulation layer 600. The second insulation layer 600 covers the first insulation layer 300 and the buried wordline structure 500.

In the present embodiment, above the first insulation layer 300, the second insulating layer 600 has a thickness ranging from 20 nm to 50 nm. In some other embodiments, the second insulating layer 600 has a thickness of 40 nm, 45 nm or 50 nm. The silicon nitride material has good insulation performance, so in addition to preventing leakage by increasing the thickness of the insulation layer, the silicon nitride material is usually selected to manufacture the second insulation layer 600. In addition, the second insulation layer 600 may also be made of silicon nitride, silicon nitride carbide or other suitable insulating materials, but is not limited thereto.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present invention, which are described specifically and in detail, and therefore cannot be construed as a limitation on the patent scope of the present invention. It should be pointed out that those of ordinary skill in the art may make various changes and improvements without departing from the ideas of the present invention, which shall all fall within the protection scope of the present invention. Therefore, the patent protection scope of the present invention shall be subject to the appended claims.

What is claimed is:

1. A manufacturing method of a semiconductor device, comprising:
   providing a semiconductor substrate having a shallow trench isolation (STI) structure and a plurality of active regions disposed in parallel;
   forming a first wordline trench structure in the semiconductor substrate;
   forming a first sacrificial layer at a bottom of the first wordline trench structure;
   filling the first wordline trench structure located in the active regions by epitaxial growth;
   forming a first insulation layer covering a top of the semiconductor substrate and the first wordline trench structure in the STI structure and sealing the first wordline trench structure;
   forming a second wordline trench structure and a fin-type structure in the active regions, a depth of the second wordline trench structure being less than that of the first wordline trench structure, and a vertical projection of the second wordline trench structure completely overlapping with a vertical projection of the first sacrificial layer;
   removing the first sacrificial layer to form a wordline tunnel in the semiconductor substrate connected with the first wordline trench structure; and
   filling the first wordline trench structure, the second wordline trench structure and the wordline tunnel to form a buried wordline structure surrounding the fin-type structure;
   wherein the semiconductor substrate is a silicon-on-insulator (SOI) substrate, comprising a silicon material layer, a back substrate and an oxide material layer sandwiched between the silicon material layer and the back substrate, and all of the STI structure, the plurality of active regions and the buried wordline structure are landing on a same horizontal top surface of the oxide material layer.

2. The manufacturing method according to claim 1, wherein the step of filling the first wordline trench structure, the second wordline trench structure and the wordline tunnel to form an buried wordline structure comprises:
   forming a gate oxide layer on a sidewall and a bottom of the second wordline trench structure and a sidewall and a top of the wordline tunnel;
   forming a metal barrier layer on the semiconductor substrate where the gate oxide layer is formed, the metal barrier layer covering the gate oxide layer, the first insulation layer and the STI structure;
   filling a metal conductive material in the first wordline trench structure, the second wordline trench structure and the wordline tunnel to form a metal conductive layer; and
   etching back the metal barrier layer and the metal conductive material in the first wordline trench structure and the second wordline trench structure to a preset height to form the buried wordline structure.

3. The manufacturing method according to claim 2, wherein the step of forming a first sacrificial layer at the bottom of the first wordline trench structure comprises:
   depositing a silicon nitride material by using an atomic layer deposition technology on the semiconductor substrate where the metal barrier layer is formed, to form a silicon nitride material layer filling the first wordline trench structure and covering the semiconductor substrate; and
   etching back the silicon nitride material layer, and controlling a thickness of the remaining silicon nitride material layer to be 20 nm to 80 nm, to form the first sacrificial layer.

4. The manufacturing method according to claim 1, wherein the first sacrificial layer is removed by a wet etching process.

5. The manufacturing method according to claim 1, wherein the first sacrificial layer has a height ranging from 20 nm to 80 nm.

6. The manufacturing method according to claim 1, wherein the step of forming a first wordline trench structure in the semiconductor substrate comprises:
- forming a photoresist layer on the semiconductor substrate;
- forming a target pattern in the photoresist layer to match the first wordline trench structure;
- etching the silicon material layer by using the patterned photoresist layer as a mask layer and the oxide material layer as an etching-stop layer, to form the first wordline trench structure; and
- removing the remaining photoresist layer.

7. The manufacturing method according to claim 6, wherein the first sacrificial layer is formed by a material having an etching selectivity greater than 1 relative to the silicon material layer and the oxide material layer.

8. The manufacturing method according to claim 1, wherein the first wordline trench structure has a width ranging from 10 nm to 25 nm.

9. The manufacturing method according to claim 1, further comprising:
- forming a second insulation layer on the semiconductor substrate where the buried wordline structure is formed, the second insulation layer covering the buried wordline structure.

10. The manufacturing method according to claim 9, wherein the second insulation layer has a thickness of 40 nm, 45 nm or 50 nm.

11. A semiconductor device, comprising:
- a semiconductor substrate having a shallow trench isolation (STI) structure and a plurality of active regions disposed in parallel;
- a buried wordline structure located in the semiconductor substrate, extending along a first direction, and crossing the STI structure and the plurality of active regions; and
- a fin-type structure located in a region where the active regions intersect with the buried wordline structure, the buried wordline structure wrapping around the fin-type structure; and,
- wherein the semiconductor substrate is a silicon-on-insulator (SOI) substrate, comprising a silicon material layer, a back substrate and an oxide material layer sandwiched between the silicon material layer and the back substrate, and all of the STI structure, the plurality of active regions and the buried wordline structure are landing on a same horizontal top surface of the oxide material layer.

12. The semiconductor device according to claim 11, wherein the buried wordline structure located below the fin-type structure has a height ranging from 20 nm to 80 nm.

13. The semiconductor device according to claim 11, wherein the buried wordline structure located above the fin-type structure has a height ranging from 10 nm to 100 nm.

14. The semiconductor device according to claim 11, wherein the buried wordline structure comprises a metal conductive layer, and the metal conductive layer is insulated from the fin-type structure and wraps around the fin-type structure.

15. The semiconductor device according to claim 14, wherein the buried wordline structure further comprises:
- a gate oxide layer disposed on a surface of the semiconductor substrate facing the metal conductive layer and wrapping the buried wordline structure; and
- a metal barrier layer disposed between the gate oxide layer and the metal conductive layer.

16. The semiconductor device according to claim 14, wherein the metal conductive layer is made of aluminum, tungsten, copper or a titanium aluminum alloy.

17. The semiconductor device according to claim 11, wherein the buried wordline structure has a width ranging from 10 nm to 25 nm.

18. The semiconductor device according to claim 11, further comprising an insulation layer covering the buried wordline structure.

* * * * *